*(12)* United States Patent
Tarutani et al.

(10) Patent No.: US 9,673,345 B2
(45) Date of Patent: Jun. 6, 2017

(54) COMPOSITION FOR SOLAR CELL SEALING FILM, METHOD FOR PRODUCING SAME AND SOLAR CELL SEALING FILM

(71) Applicant: BRIDGESTONE CORPORATION, Tokyo (JP)

(72) Inventors: Yasunori Tarutani, Kodaira (JP); Norihiko Kaga, Kodaira (JP); Hisataka Kataoka, Yokohama (JP); Takato Inamiya, Yokohama (JP); Akira Yoshitake, Yokohama (JP)

(73) Assignee: BRIDGESTONE CORPORATION, Tokyo (JP)

( * ) Notice: Subject to any disclaimer, the term of this patent is extended or adjusted under 35 U.S.C. 154(b) by 0 days.

(21) Appl. No.: 14/891,374

(22) PCT Filed: May 23, 2014

(86) PCT No.: PCT/JP2014/063713
§ 371 (c)(1),
(2) Date: Nov. 16, 2015

(87) PCT Pub. No.: WO2014/189132
PCT Pub. Date: Nov. 27, 2014

(65) Prior Publication Data
US 2016/0087130 A1    Mar. 24, 2016

(30) Foreign Application Priority Data

May 24, 2013  (JP) ................. 2013-109601

(51) Int. Cl.
| | | |
|---|---|---|
| C08L 23/00 | (2006.01) | |
| H01L 31/048 | (2014.01) | |
| C08K 5/14 | (2006.01) | |
| C08L 23/06 | (2006.01) | |
| C08L 23/08 | (2006.01) | |
| C08J 5/18 | (2006.01) | |

(52) U.S. Cl.
CPC ............ *H01L 31/0481* (2013.01); *C08J 5/18* (2013.01); *C08K 5/14* (2013.01); *C08L 23/06* (2013.01); *C08L 23/0815* (2013.01); *C08J 2323/06* (2013.01); *C08J 2323/08* (2013.01); *C08J 2423/06* (2013.01); *C08J 2423/08* (2013.01); *C08L 2203/162* (2013.01); *C08L 2203/204* (2013.01); *C08L 2203/206* (2013.01); *C08L 2205/025* (2013.01); *C08L 2207/064* (2013.01); *C08L 2207/066* (2013.01); *C08L 2312/00* (2013.01); *Y02E 10/50* (2013.01)

(58) Field of Classification Search
CPC ..... H01L 31/0481; C08J 5/18; C08J 2323/06; C08J 2323/08; C08J 2423/06; C08J 2423/08; C08K 5/14; C08L 23/06; C08L 23/0815; C08L 2203/162; C08L 2203/204; C08L 2203/206; C08L 2205/025; C08L 2207/064; C08L 2207/066; C08L 2312/00
See application file for complete search history.

(56) References Cited

U.S. PATENT DOCUMENTS

| | | | |
|---|---|---|---|
| 2004/0072005 A1 | 4/2004 | German et al. | |
| 2007/0267059 A1 | 11/2007 | Nishijima et al. | |
| 2012/0316284 A1* | 12/2012 | Wang et al. | ........ C08L 23/0815 524/528 |
| 2013/0174907 A1 | 7/2013 | Murasawa et al. | |

FOREIGN PATENT DOCUMENTS

| | | |
|---|---|---|
| CN | 1535296 A | 10/2004 |
| CN | 102918659 A | 2/2013 |
| EP | 2 579 331 A1 | 4/2013 |
| JP | 2006-210906 A | 8/2006 |
| JP | 2011-003783 A | 1/2011 |
| JP | 2012-015204 A | 1/2012 |
| JP | 2013-008980 A | 1/2013 |
| JP | 2013-021082 A | 1/2013 |
| WO | 99/29737 A1 | 6/1999 |
| WO | 0198409 A1 | 12/2001 |
| WO | 2012/056687 A1 | 5/2012 |

OTHER PUBLICATIONS

Communication dated Jun. 2, 2016, issued by the State Intellectual Property Office of the P.R.C. in corresponding Chinese Application No. 201480030035.8.

(Continued)

*Primary Examiner* — Nathan M Nutter
(74) *Attorney, Agent, or Firm* — Sughrue Mion, PLLC

(57) ABSTRACT

The present invention provides a composition for a solar cell sealing film prepared by mixing an ethylene-α-olefin copolymer a metallocene catalyst (m-LLDPE) and another polymer as resin components, wherein the composition has the same processability as a composition containing m-LLDPE alone as a resin component and provides a solar cell sealing film having the same transparency as the composition containing m-LLDPE alone as resin component.

A composition for a solar cell sealing film comprising m-LLDPE and low-density polyethylene (LDPE), wherein the weight average molecular weight of m-LLDPE ($M_{w(m-LLDPE)}$) is 200,000 or less, the weight average molecular weight of LDPE ($M_{w(LDPE)}$) is 250,000 or less, and the mass ratio of m-LLDPE to LDPE (m-LLDPE: LDPE) is in a range of 80:20 to 30:70, and a solar cell sealing film prepared using the same.

10 Claims, 1 Drawing Sheet

(56) References Cited

OTHER PUBLICATIONS

Machine translation of JP 2013-021082 A (published Jan. 31, 2013).
Machine translation of WO 2012/056687 A1 (published May 3, 2012).
Khanna, et al., "Dynamic Mechanical Relaxations in Polyethylene", Macromolecules, 1985, vol. 18, pp. 1302-1309.
Communication, dated Apr. 22, 2016, from the European Patent Office in counterpart European application No. 14800842.8.
International Search Report of PCT/JP2014/063713 dated Aug. 12, 2014.

\* cited by examiner

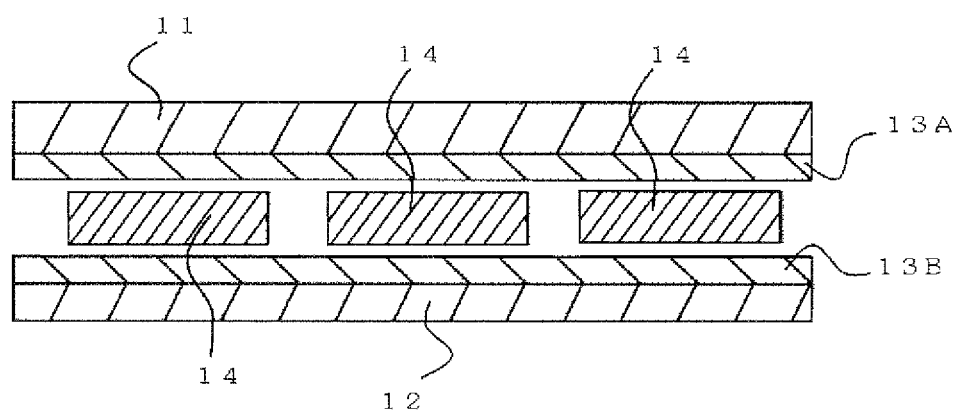

COMPOSITION FOR SOLAR CELL SEALING FILM, METHOD FOR PRODUCING SAME AND SOLAR CELL SEALING FILM

TECHNICAL FIELD

The present invention relates to a composition used for forming a solar cell sealing film, and particularly to a composition comprising an ethylene-α-olefin copolymer polymerized by using a metallocene catalyst and another polymer, wherein the composition has excellent processability such as film formability and is able to provide a sealing film excellent in transparency.

BACKGROUND ART

Until now, solar cell modules that directly convert sunlight into electric energy have been widely used in view of effective use of resources and prevention of environmental pollution. Further development of solar cell modules is in progress for improved power generation efficiency, improved weather resistance, and reduced production cost.

A solar cell module is generally produced by laminating a front side transparent protecting member 11 such as a glass substrate, a front side sealing film 13A, solar cells 14 such as silicon crystal photovoltaic elements, a backside sealing film 13B and a backside protecting member (back cover) 12 in this order, as shown in FIG. 1, removing air under vacuum, and heating and pressurizing the stack to cure the front side sealing film 13A and the backside sealing film 13B through crosslinking, thereby adhering and integrating them.

In the solar cell module, a plurality of solar cells 14 mutually connected are used in order to obtain a large amount of electric power. To ensure insulation properties of the solar cells 14, the solar cells are sealed with the sealing films 13A and 13B which have insulation properties.

Meanwhile, development of thin-film solar cell modules prepared using thin-film solar cells such as a thin-film silicon solar cell, a thin-film amorphous silicon solar cell and a copper indium selenide (CIS) solar cell has been promoted. The thin-film solar cell module is produced by forming a photovoltaic element layer such as a semiconductor layer on a surface of a transparent substrate such as a glass substrate or a polyimide substrate by e.g., a chemical vapor deposition method; laminating a sealing film on the photovoltaic element layer; and allowing them to adhere into one body.

Recently, a solar cell sealing material, which is a composition comprising an ethylene-α-olefin copolymer polymerized by using a metallocene catalyst (hereinafter referred to also as m-LLDPE), has been developed (Patent Document 1). Patent Document 1 teaches that a sealing material formed from a composition comprising m-LLDPE and having predetermined physical properties is crosslinked in a relatively short time by an organic peroxide, which provides the sealing material with sufficient adhesivity. This can be expected to enable solar cell modules to attain not only lower production cost but excellent transparency, flexibility, and weather resistance as well as a stable conversion efficiency for a long time.

PRIOR ART DOCUMENT

Patent Document

Patent Document 1: JP A 2013-8980

SUMMARY OF INVENTION

Problems to be Solved by the Invention m-LLDPE is expensive, however, and thus the problem arises that the cost of a solar cell sealing material is increased. To reduce the cost of the sealing material, it is conceivable to include another inexpensive polymer. Patent Document 1 also teaches that a low-density polyethylene produced by a high pressure method can be added in an amount of 3 to 75 parts by weight to impart melt tension.

However, in the course of their studies, the present inventors found that compositions including m-LLDPE and another polymer as resin components have low processability in producing solar cell sealing films, as compared to a composition containing m-LLDPE alone as a resin component.

When a solar cell sealing film is produced from a resin composition, first, materials are mixed in a primary kneading step and thereafter, if necessary, the mixture is subjected to roll kneading in a secondary kneading step and then formed into a film by calendaring, extrusion or the like.

In this case, since the dynamic viscoelasticity, which can be evaluated based on elastic modulus, of the resin composition after the primary kneading step has a significant influence on processability such as film formability in the film formation step. Thus, it is necessary to control the elastic modulus of the resin composition within a predetermined range (also referred to as "elastic modulus range suitable for processing").

Particularly in calendering, the elastic modulus range suitable for processing is relatively narrow. Since the elastic modulus of a resin composition generally changes in accordance with the temperature, elastic modulus can be controlled by changing the temperature of the resin composition.

However, in the film formation step, it is generally difficult to accurately control the temperature of a resin composition. Thus, if the width of a temperature range in which the elastic modulus range suitable for processing can be obtained (also referred to as "temperature width suitable for processing") is narrow, it becomes difficult to process a resin into a film in the film formation step. This is a problem.

In addition, if the temperature at which the elastic modulus range suitable for processing of a resin composition can be obtained increases, energy cost increases. Furthermore, the temperature sometimes exceeds a temperature range that can be controlled by a temperature controlling solvent in a film forming apparatus, with the result that an existing apparatus cannot be used.

It was found that compositions including m-LLDPE and another polymer as resin components raise such a problem that the composition is less processable than a composition containing m-LLDPE alone as a resin component.

It was also found that a solar cell sealing film formed from such a resin mixed composition by, e.g., calendering is low in transparency (can be evaluated based on light transmittance) as compared to the case of containing m-LLDPE alone as a resin component.

An object of the present invention is to provide: a composition for a solar cell sealing film comprising a mixture of m-LLDPE and another polymer as resin components, wherein the composition has processability equivalent to that of the composition containing m-LLDPE alone as a resin component and is able to provide a solar cell sealing film having transparency equivalent to that of a film formed of the composition containing m-LLDPE alone as a resin component; a method for producing the same; and the solar cell sealing film.

Means for Solving the Problems

The above object can be achieved by a composition for a solar cell sealing film comprising an ethylene-α-olefin copolymer polymerized using a metallocene catalyst (m-LLDPE), and a low-density polyethylene (LDPE), in which the weight average molecular weight ($M_{w(m\text{-}LLDPE)}$) of m-LLDPE is 200,000 or less, the weight average molecular weight ($M_{w(LDPE)}$) of LDPE is 250,000 or less, and the mass ratio of m-LLDPE to LDPE (m-LLDPE:LDPE) is in a range of 80:20 to 30:70.

When m-LLDPE and LDPE to be included in a composition for a solar cell sealing film have the above weight average molecular weights and are used in a content ratio satisfying the above range, the composition has processability equivalent to that of a composition containing m-LLDPE alone as a resin component, even if m-LLDPE and LDPE are used in combination.

Thus, even if calendering is used for film formation, the film can be easily formed and the resultant solar cell sealing film has transparency equivalent to that of a film prepared from the composition containing m-LLDPE alone as a resin component.

Preferred embodiments of the composition for a solar cell sealing film of the present invention are as follows.

(1) The weight average molecular weight of m-LLDPE is 100,000 to 200,000 and the weight average molecular weight of LDPE is 50,000 to 250,000. It is possible to obtain a composition having high processability.

(2) The ratio ($M_{w(LDPE)}/M_{n(LDPE)}$), which is a ratio of the weight average molecular weight of LDPE ($M_{w(LDPE)}$) to a number average molecular weight of LDPE ($M_{n(LDPE)}$), is 1.0 or more larger than a ratio ($M_{w(m\text{-}LLDPE)}/M_{n(m\text{-}LLDPE)}$), which is a ratio of the weight average molecular weight of m-LLDPE ($M_{w(m\text{-}LLDPE)}$) to a number average molecular weight of m-LLDPE ($M_{m(m\text{-}LLDPE)}$). The above ratio ($M_w/M_n$) represents a degree of a molecular weight distribution. Since the molecular weight distribution of m-LLDPE is generally narrow, the temperature range in which an elastic modulus changes tends to be narrow. Accordingly, if the molecular weight distribution of LDPE is large, the above temperature width suitable for processing can be broadened, with the result that processability can be further improved.

(3) The ratio of the weight average molecular weight of LDPE ($M_{w(LDPE)}$) to a number average molecular weight of LDPE ($M_{r(LDPE)}$), is 3.30 or more, and a ratio ($M_{w(m\text{-}LLDPE)}/M_{n(m\text{-}LLDPE)}$), which is a ratio of the weight average molecular weight of m-LLDPE ($M_{w(n\text{-}LLDPE)}$) to a number average molecular weight of m-LLDPE ($M_{n(m\text{-}LLDPE)}$), is 2.25 or less.

(4) The average diameter of crystals in the composition is 1.0 µm or less. The transparency of the resultant solar cell sealing film can be improved.

(5) The temperature at which a storage elastic modulus of the composition is 100 kPa is 70 to 100° C., and a difference between a temperature at which the storage elastic modulus of the composition is 30 kPa and the temperature at which the storage elastic modulus of the composition is 100 kPa is 3.5° C. or more. If the composition has the properties defined by the above ranges, it can be said that the composition can be easily formed into a film by calendering, in other words, the composition is excellent in processability.

(6) An organic peroxide is further contained. The resultant solar cell sealing film can be improved in transparency.

(7) The organic peroxide is 2,5-dimethyl-2,5-di(t-butylperoxy)hexane. This is a particularly effective organic peroxide.

The above object can be attained by a method for producing a composition (6) or (7) for a solar cell sealing film comprising an organic peroxide, including a step of preparing a masterbatch by mixing the organic peroxide with the LDPE as mentioned above and a step of mixing the masterbatch and the m-LLDPE as mentioned above. When a solar cell sealing film is produced from the composition obtained by this method, the organic peroxide can act principally on the LDPE to efficiently lower the degree of crystallization, thus making the solar cell sealing film more transparent.

The above object can be achieved by a solar cell sealing film formed from the composition for a solar cell sealing film of the present invention. The solar cell sealing film of the present invention is preferably formed by calendering. The solar cell sealing film of the present invention is formed from the composition of the present invention, and hence can be easily formed even by calendering while having a high transparency.

Effects of the Invention

According to the present invention, even if m-LLDPE and LDPE are combined in a composition for a solar cell sealing film, the composition has processability equivalent to that of a composition containing m-LLDPE alone as a resin component. Therefore, the film can be easily formed even by calendering and a solar cell sealing film can be obtained with transparency equivalent to that of a film from the composition containing m-LLDPE alone as a resin component. Accordingly, it can be said that the solar cell sealing film of the present invention is high in quality and low in cost.

BRIEF DESCRIPTION OF DRAWING

FIG. 1 is a sectional view of a general solar cell module.

MODE FOR CARRYING OUT THE INVENTION

[Composition for Solar Cell Sealing Film]

The composition for a solar cell sealing film of the present invention contains an ethylene-α-olefin copolymer polymerized using a metallocene catalyst (m-LLDPE), and a low-density polyethylene (LDPE), in which the weight average molecular weight of the m-LLDPE ($M_{w(m\text{-}LLDPE)}$) is 200,000 or less, the weight average molecular weight of the LDPE ($M_{w(LDPE)}$) is 250,000 or less, and the mass ratio of the m-LLDPE to the LDPE (m-LLDPE:LDPE) is in a range of 80:20 to 30:70.

When a solar cell sealing film is produced as mentioned above by using a resin composition, first, a primary kneading step of mixing materials by use of, for example, a twin-screw kneader, is performed; and then, if necessary, a secondary kneading step such as roll kneading is performed and then the film is formed in accordance with calendering or extrusion.

In this case, since dynamic viscoelasticity, which can be evaluated based on elastic modulus, of the resin composition in a step such as the film forming step after the primary kneading step, has a significant influence on processability such as film formability, it is necessary to control the elastic modulus of the resin composition within a predetermined range (elastic modulus range suitable for processing). Particularly, to obtain satisfactory film formability in the calendering, the storage elastic modulus of the resin composition in the film formation step is preferably 30 to 100 kPa.

Since the elastic modulus of a resin composition varies generally depending upon the temperature, the elastic modulus can be controlled by changing the temperature of the resin composition. Since the variation of the elastic modulus depending upon the temperature differs depending upon the resin composition, the width of a temperature range in which the elastic modulus range suitable for processing can be obtained (temperature width suitable for processing) differs depending upon the resin composition.

Generally, in a film formation step or the like, it is difficult to accurately control the temperature of a resin composition, and therefore it is preferable that the temperature width suitable for processing (in other words, the difference between temperatures at which the storage elastic moduli of the composition are 30 kPa and 100 kPa, respectively) of a resin composition be wider, specifically, 3.5° C. or more.

As to the temperature at which the elastic modulus range suitable for processing can be obtained, if the temperature increases, the energy cost increases. In addition, in the case of using a film forming apparatus such as a calendering apparatus using e.g., water as a temperature controlling solvent, if the temperature exceeds the temperature controllable by water, processing may not be able to be performed.

Accordingly, the temperature at which the elastic modulus range suitable for processing can be obtained (i.e. the temperature at which the storage elastic modulus of the composition is 100 kPa, which is also referred to as "softening temperature") is preferably 100° C. or less, more preferably 70 to 100° C., further preferably 85 to 98° C.

The storage elastic modulus of a resin composition can be measured by a dynamic viscoelasticity tester, for example, RPA-2000 (manufactured by Alpha Technology Co., Ltd.).

In the case of a resin composition containing m-LLDPE alone as resin component, the temperature at which the elastic modulus range suitable for processing can be obtained is 100° C. or less, and the temperature width suitable for processing is 3.5° C. or more. These are acceptable ranges for calendering.

In contrast, in the resin composition which also includes LDPE for reduced resin cost or controlled physical properties, a temperature giving the elastic modulus range suitable for processing may exceed 100° C. depending upon the weight average molecular weights of m-LLDPE and LDPE and the content ratio thereof (as described later in Examples) and the processability may be lower than that of a composition containing m-LLDPE alone. In this case, transparency of the resultant solar cell sealing film may decrease.

In the present invention, when m-LLDPE and LDPE to be included in a composition for a solar cell sealing film have the aforementioned weight average molecular weights and are used in a content ratio within the above range, the composition has processability equivalent to a composition containing m-LLDPE alone as resin component, even though m-LLDPE and LDPE are used in combination. Thus, even if a film is formed by calendering, the film can be easily formed and the resultant solar cell sealing film has transparency equivalent to that of a film from the composition containing m-LLDPE alone as a resin component.

In the present invention, the weight average molecular weight of m-LLDPE is preferably 100,000 to 200,000, more preferably 100,000 to 170,000. The weight average molecular weight of LDPE is preferably 50,000 to 250,000 and further preferably 80,000 to 250,000. When m-LLDPE and LDPE each satisfy the weight average molecular weight of the aforementioned range, a composition having further higher processability can be obtained. The smaller the difference between the weight average molecular weights of the m-LLDPE and the LDPE, the more preferable. The mass ratio of m-LLDPE to LDPE (m-LLDPE:LDPE) in the above composition is preferably 40:60 to 30:70, more preferably 50:50 to 30:70. If the proportion of LDPE, which is inexpensive, increases, the cost of the resin material can be further reduced.

In the present invention, it is preferred that the ratio $(M_{w(LDPE)}/M_{n(LDPE)})$, which is the ratio of the weight average molecular weight of the LDPE $(M_{w(LDPE)})$ to the number average molecular weight $(M_{n(LDPE)})$ (in short, the molecular weight distribution of LDPE) is 1.0 or more larger than the ratio $(M_{w(m-LLDPE)}/M_{n(m-LLDPE)})$, which is the ratio of the weight average molecular weight of m-LLDPE $(M_{w(m-LLDPE)})$ to the number average molecular weight of m-LLDPE $(M_{n(m-LLDPE)})$ (in short, the molecular weight distribution of m-LLDPE). Since the molecular weight distribution of m-LLDPE is generally narrow, the temperature range in which elastic modulus changes tends to be narrow. Accordingly, it is better that the molecular weight distribution of LDPE is wider to the extent as described above, because the aforementioned temperature width suitable for processing can be broadened and processability can be further improved.

The ratio $(M_{w(LDPE)}/M_{n(LDPE)})$, which is the ratio of the weight average molecular weight of LDPE $(M_{w(LDPE)})$ to the number average molecular weight $(N_{n(LDPE)})$ thereof, is preferably 3.30 or more, more preferably 3.30 to 10.0, further preferably 3.30 to 8.00. The ratio $(M_{w(m-LLDPE)}/M_{n(m-LLDPE)})$, which is the ratio of the weight average molecular weight of the m-LLDPE $(M_{w(m-LLDPE)})$ to the number average molecular weight $(M_{n(m-LLDPE)})$ thereof, is preferably 2.25 or less, more preferably 1.50 to 2.25 and further preferably 2.00 to 2.25.

The weight average molecular weights $(M_w)$ of LDPE and m-LLDPE and the number average molecular weights $(M_n)$ thereof can be determined based on measurement using high temperature GPC (gel permeation chromatography (HLC-8121GPC/HT, manufactured by Tohso Corporation), TSK-gel $GMH_{HR}$-H (20) HT as a column and 1,3,5-trichlorobenzene as a solvent at a measurement temperature of 145° C.

Since the composition for a solar cell sealing film of the present invention contains highly crystalline LDPE having large crystals, crystals are observed in the composition. However, as the size of the crystals decreases, the transparency of the resultant solar cell sealing film increases. The average diameter of crystals in the composition is preferably 1.0 μm or less, more preferably 0.4 μm or less, further preferably 0.1 μm or less.

Furthermore, the degree of crystallization of the composition of the present invention is preferably 50% or less, more preferably 45% or less, further preferably 40% or less. As described later, the composition of the present invention may contain an organic peroxide, which is capable of inducing crosslinking when the composition is used as a solar cell sealing film; however, the average diameter of crystals and the degree of crystallization mentioned above represent those of the composition before crosslinking.

The average diameter of crystals can be determined as a circle-equivalent diameter, which is obtained by subjecting a photograph of an image of a section of a resin composition (sectioned by a microtome) magnified by a transmission electron microscope or a photograph of a section of a resin composition obtained by elastic modulus mapping by AFM (atom force microscope) to analysis using image processing software (Winroof) (manufactured by MITANI CORPORATION). The degree of crystallization can be obtained by DSC (differential scanning calorimeter) (manufactured by TA Instruments) at a temperature increasing rate of 10° C./minute.

The materials of the composition of the present invention will be more specifically described below.

[Ethylene-α-Olefin Copolymer Polymerized Using a Metallocene Catalyst (m-LLDPE)]

The m-LLDPE contained in the composition of the present invention may be an ethylene-α-olefin copolymer (including e.g., a terpolymer) having an ethylene unit as main component and one or more units from α-olefins having 3 to 12 carbon atoms, such as propylene, 1-butene, 1-hexene, 1-octene, 4-methylpentene-1, 4-methyl-hexene-1 and 4,4-dimethyl-pentene-1, as long as it has the above weight average molecular weight and preferably the above molecular weight distribution.

Examples of the ethylene-α-olefin copolymer include an ethylene-1-butene copolymer, an ethylene-1-octene copolymer, an ethylene-4-methyl-pentene-1 copolymer, an ethylene-butene-hexene terpolymer, an ethylene-propylene-octene terpolymer and an ethylene-butene-octene terpolymer. The content of α-olefin in the ethylene-α-olefin copolymer is preferably 5 to 40% by mass, more preferably 10 to 35% by mass and further preferably 15 to 30% by mass. If the content of α-olefin is low, flexibility and impact resistance of the resultant solar cell sealing film may not be sufficient. In contrast, if the content of α-olefin is excessive, the heat resistance may decrease.

As the metallocene catalyst for use in polymerization for m-LLPDE, any metallocene catalyst known in the art may be used and the metallocene catalyst is not particularly limited. A metallocene catalyst is generally a complex of a metallocene compound, which is a compound having a structure obtained by sandwiching a transition metal such as titanium, zirconium and hafnium between unsaturated cyclic compounds of a cyclopentadienyl group or a substituted cyclopentadienyl group of the π electron system, and a cocatalyst such as an aluminum compound including alkylaluminoxane, alkylaluminum, aluminum halide and alkylaluminum halide. The metallocene catalyst has a homogeneous active spot (single site catalyst) and usually can provide a polymer having a narrow molecular weight distribution and having virtually the same comonomer content per molecule.

In the present invention, the density of m-LLDPE (based on JIS K 7112, the same shall apply below), which is not particularly limited, is preferably 0.860 to 0.930 g/cm$^3$. The melt flow rate (MFR) (based on JIS-K7210) of m-LLDPE, which is not particularly limited, is preferably 1.0 g/10 minutes or more, more preferably 1.0 to 50.0 g/10 minutes and further preferably 3.0 to 30.0 g/10 minutes. Note that MFR is determined at 190° C. and at a load of 21.18 N.

In the present invention, a commercially available m-LLDPE can also be used. Examples thereof include HARMOREX series and KERNEL series manufactured by Japan Polyethylene Corporation; Evolue series manufactured by Prime Polymer Co., Ltd.; and EXCELLEN GMH and EXCELLEN FX series manufactured by SUMITOMO CHEMICAL Co., Ltd.

[Low-Density Polyethylene (LDPE)]

As the LDPE contained in the composition of the present invention, any LDPE may be used as long as it has the aforementioned weight average molecular weight, and preferably the aforementioned molecular weight distribution. LDPE generally has a long branched chain, which is obtained by polymerization of ethylene in the presence of a radical generator such as an organic peroxide at a high pressure of 100 to 350 MPa.

In the present invention, the density of LDPE (based on JIS K 7112), which is not particularly limited, is preferably 0.910 to 0.930 g/cm$^3$. The melt flow rate (MFR) (based on JIS-K7210) of LDPE, which is not particularly limited, is preferably 1.0 g/10 minutes or more, more preferably 1.0 to 150.0 g/10 minutes and further preferably 20.0 to 140.0 g/10 minutes. Note that MFR is determined at 190° C. and at a load of 21.18 N.

In the present invention, a commercially available LDPE can also be used. Examples thereof include UBE polyethylene series manufactured by Ube Maruzen Co., Ltd., low-density polyethylene series manufactured by QAPCO, PETROSEN series manufactured by Tohso Corporation and SUMIKATHENE series manufactured by SUMITOMO CHEMICAL Co., Ltd.

[Organic Peroxide]

It is preferable that the composition for a solar cell sealing film of the present invention further contain an organic peroxide. When the composition is used for forming a solar cell sealing film, polyethylene can be crosslinked by heating the organic peroxide. This can further improve the transparency of the solar cell sealing film. This is considered to occur because the crystallinity of polyethylene changes by its crosslinking, with the typical result that the degree of crystallinity decreases and the average diameter of crystals reduces.

As the organic peroxide, any organic peroxide can be used as long as it is decomposed at a temperature of 100° C. or more to generate radicals. Generally, the organic peroxide is selected in consideration of temperature for film formation, conditions for preparing a composition, curing temperature and heat resistance and storage stability of a material to be sealed. Particularly, an organic peroxide having a decomposition temperature of 70° C. or more at a half-life period of 10 hours is preferable.

Examples of the organic peroxide include dicumylperoxide, 2,5-dimethyl-2,5-di(tert-butylperoxy)hexane, 2,5-dimethyl-2,5-di(2-ethylhexanoylperoxy)hexane, 1-cyclohexyl-1-methylethylperoxy-2-ethylhexanoate, tert-hexylperoxy-2-ethylhexanoate, 4-methylbenzoylperoxide, tert-butylperoxy-2-ethyl hexanoate, benzoylperoxide, 1,1-bis(tert-butylperoxy)-2-methylcyclohexane, 1,1-bis(tert-hexylperoxy)-3,3,5-trimethylcyclohexane, 1,1-bis(tert-hexylperoxy)cyclohexane, 1,1-bis(tert-butylperoxy)-3,3,5-trimethylcyclohexane, 1,1-bis(tert-butylperoxy) cyclohexane, 2,2-bis(4,4-di-tert-butylperoxycyclohexyl) propane, 1,1-bis(tert-butylperoxy)cyclododecane, tert-hexylperoxyisopropylmonocarbonate, tert-butylperoxymaleic acid, tert-butylperoxy-3,3,5-trimethylhexane, tert-butylperoxylaurate, 2,5-dimethyl-2,5-di(methylbenzoylperoxy)hexane, tert-butylperoxyisopropylmonocarbonate, tert-butylperoxy-2-ethyl hexylmonocarbonate, tert-hexylperoxybenzoate and 2,5-dimethyl-2,5-di(benzoylperoxy)hexane.

As the organic peroxide, 2,5-dimethyl-2,5-di(tert-butylperoxy)hexane is particularly preferable. With this species of organic peroxide, a solar cell sealing film having excellent transparency and high insulation properties can be obtained.

The content of the organic peroxide, which is not particularly limited, is preferably 0.1 to 5 parts by mass, more preferably 0.2 to 3 parts by mass based on 100 parts by mass of the resin components (the total mass of m-LLDPE and LDPE).

[Other Components]

As long as the effects of the invention are not damaged, the composition of the present invention may contain another polymer such as a linear low-density polyethylene (LLDPE) and, if necessary, additives such as a crosslinking aid (a compound having a radically polymerizable group as a functional group, for example, triallyl cyanurate, triallyleisocyanurate), an adhesion improver (e.g., a silane coupling agent), a plasticizer, a UV absorber, a light stabilizer, an antioxidant, an acryloxy group containing compound, a methacryloxy group containing compound and/or an epoxy group containing compound in order to improve or control various physical properties (mechanical strength, adhesive properties, optical characteristics such as transparency, heat resistance, lightfastness, crosslinking rate).

[Method for Producing Composition for Solar Cell Sealing Film]

The composition for a solar cell sealing film of the present invention may be produced in any manner. Usually, the composition is produced by adding m-LLDPE and LDPE, and, if necessary, the aforementioned materials in e.g., a super mixer (fast-flow mixer), a twin screw kneader, a kneader having a planetary gear mechanism or a single screw extruder, and kneading them.

The conditions for kneading are not particularly limited; however, kneading is preferably performed at a shearing speed of 10 to 1500 $s^{-1}$, further preferably 100 to 1000 $s^{-1}$, and particularly preferably 200 to 800 $s^{-1}$. The kneading temperature particularly for a composition comprising an organic peroxide is preferably a temperature at which the organic peroxide does not react or hardly reacts. The temperature is preferably 70 to 130° C., further preferably 80 to 120° C.

When an organic peroxide and other additives are included in the composition, a method in which additives (part or the whole) are kneaded with a part of a resin component(s) (m-LLDPE and/or LDPE) to prepare a masterbatch and thereafter, the masterbatch and the remaining resin component(s) (and if necessary the remaining additives) are blended such that the additives are contained in predetermined amounts, can be used.

When a composition particularly comprising an organic peroxide is produced, preference is given to using a production method including a step of preparing a masterbatch by mixing an organic peroxide with LDPE and a step of mixing the masterbatch and m-LLDPE. When a solar cell sealing film is produced from the composition thus obtained, the organic peroxide can act mainly on easily crystallizable LDPE to efficiently lower the degree of crystallization, thus making the solar cell sealing film more transparent.

In the production method mentioned above, a predetermined amount of an organic peroxide may be wholly added to LDPE to prepare a masterbatch which is then mixed with m-LLDPE; or a predetermined amount of an organic peroxide may be partially added to LDPE to prepare a masterbatch and the remaining organic peroxide may be added when the masterbatch is mixed with m-LLDPE. Alternatively, an organic peroxide, LDPE and m-LLDPE may be mixed simultaneously.

[Solar Cell Sealing Film]

The solar cell sealing film of the present invention can be obtained by forming a film from the composition for a solar cell sealing film of the present invention.

The solar cell sealing film of the present invention can be produced by subjecting the composition of the present invention, if necessary, to secondary kneading such as roll kneading, and then subjecting to film formation by extrusion or calendering employed generally to thereby obtain a sheet. A film is particularly preferably formed by calendering. This is because the composition of the present invention used here has processability of easily forming a film even by calendering.

The heating temperature during film formation, particularly for a composition comprising an organic peroxide, is preferably a temperature at which an organic peroxide does not react or hardly reacts, more specifically, 50 to 90° C., and particularly 40 to 80° C. The thickness of a solar cell sealing film is not particularly limited and can be set as appropriate. The thickness is generally in the range of 50 μm to 2 mm.

Since the solar cell sealing film of the present invention is produced from the composition of the present invention; more specifically, since LDPE is mixed with m-LLDPE, the cost of the resin materials is reduced and the transparency and processability are equivalent to those of a composition containing m-LLDPE alone as a resin component. Thus, the solar cell sealing film of the present invention is a solar cell sealing film of high quality and low cost.

[Solar Cell Module]

In the production of a solar cell module using the solar cell sealing film of the present invention, the solar cell module is usually produced by interposing the solar cell sealing film(s) of the present invention between a front side transparent protecting member and a backside protecting member and allowing them to adhere into one body, thereby sealing solar cells.

To sufficiently seal the solar cells, it is sufficient that a front side transparent protecting member, a front side sealing film, solar cells, a backside sealing film and a backside protecting member are stacked in this order; the layers are preparatorily pressed under reduced pressure to adhere; the remaining air between the layers is removed; and the sealing films are heated and pressed to adhere.

In this case, if the composition of the present invention contains an organic peroxide, the sealing film can be cured by crosslinking. Note that, in the present invention, the side of a solar cell to which light is applied (light receiving side) is referred to as a "front side"; whereas the side opposite the light-receiving side of the solar cell is referred to as a "backside".

A solar cell module is produced, for example, by stacking a front side transparent protecting member 11, a front side sealing film 13A, solar cells 14, a backside sealing film 13B and a backside protecting member 12, as shown in FIG. 1; and curing the sealing films 13A and 13B by crosslinking (in the case that a sealing film composition contains an organic peroxide) in accordance with a conventional method such as heating and pressurizing. In order to perform the heating and pressurizing, the stack may be heated and pressed, for example, by a vacuum laminator at a temperature of 135 to 180° C., preferably 140 to 180° C., particularly preferably 155 to 180° C. for a deaeration time of 0.1 to 5 minutes and at a pressure of 0.1 to 1.5 kg/cm$^2$ for a pressing time 5 to 15 minutes.

When the sealing film composition contains an organic peroxide, LDPE contained in the front side sealing film 13A and the backside sealing film 13B can be crosslinked during the heating and pressurizing step. The front side transparent protecting member 11, the backside protecting member 12, and the solar cells 14 are integrated into one body via the front side sealing film 13A and the backside sealing film 13B. In this manner, the solar cells 14 are sufficiently sealed.

The solar cell sealing film of the present invention can be used as the sealing film not only for a solar cell module using a single crystal silicon or polycrystalline silicon cell (as shown in FIG. 1) but also for a thin-film solar cell modules such as a thin-film silicon cell module, a thin-film amorphous silicon cell module or a copper indium selenide (CIS) cell module.

In this case, there can be mentioned a structure obtained by forming a thin-film solar cell element layer on a surface of a front side transparent protecting member such as a glass substrate, a polyimide substrate or a fluororesin-based transparent substrate by e.g., a chemical vapor deposition method, and stacking a backside sealing film and a backside protecting member on the thin-film solar cell element layer, thereby allowing them to adhere into one body; a structure obtained by stacking a front side sealing film and a front side transparent protecting member on a solar cell element layer formed on a surface of a backside protecting member and allowing them to adhere into one body; or a structure obtained by stacking a front side transparent protecting member, a front side sealing film, a thin-film solar cell element, a backside sealing film and a backside protecting member in this order and allowing them to adhere into one body.

It is satisfactory that the front side transparent protecting member 11 to be used in the present invention is usually a glass substrate formed of e.g., silicate glass. The thickness of the glass substrate is generally 0.1 to 10 mm, preferably 0.3 to 5 mm. The glass substrate may generally be chemically or thermally reinforced.

As the backside protecting member 12 to be used in the present invention, a plastic film such as polyethylene terephthalate (PET) is preferably used. Furthermore, in consideration of heat resistance and heat/humidity resistance, a poly(ethylene fluoride) film, in particular, a laminate film obtained by laminating a poly(ethylene fluoride) film/ Al/poly(ethylene fluoride) film in this order may be used.

EXAMPLES

The present invention will be described by way of Examples, below.

Examples 1 to 9, Comparative Examples 1 to 4 m-LLDPE and LDPE having physical properties shown in Table 1 were kneaded by a Labo Plasto mill (manufactured by TOYO SEIKI KOGYO Co. Ltd.) in the kneading conditions shown in Table 1 to prepare m-LLDPE and LDPE mixed compositions according to Examples 1 to 9 and Comparative Examples 1 to 4. The resin materials are as follows.

m-LLDPE (1): KS240T (manufactured by Japan Polyethylene Corporation)
m-LLDPE (2): KS340T (manufactured by Japan Polyethylene Corporation)
m-LLDPE (3): KJ640T (manufactured by Japan Polyethylene Corporation)
LDPE (1): F120N (manufactured by Ube Maruzen Co., Ltd.)
LDPE (2): J2516 (manufactured by Ube Maruzen Co., Ltd.)
LDPE (3): MG70 (manufactured by QAPCO)
LDPE (4): PETROSEN 353 (manufactured by Tohso Corporation)

1.5 parts by mass of 2,5-dimethyl-2,5-di(t-butylperoxy) hexane (PERHEXA 25B) was blended as an organic peroxide to each composition.

To evaluate the processability of the compositions obtained above, the softening temperature (at which the storage elastic modulus of the composition is 100 kPa) and temperature width suitable for processing (in which storage elastic modulus falls within 30 to 100 kPa) were determined by RPA-2000 (manufactured by Alpha Technologies).

As the acceptance and rejection criteria, ⊚ was used for a softening temperature of 70° C. or more and 95° C. or less, ○ for a softening temperature of higher than 95° C. and 100° C. or less, and x for a softening temperature of higher than 100° C. A temperature width suitable for processing of 3.5° C. or more was indicated by ○ and a temperature width suitable for processing of less than 3.5° C. by x.

With respect to the compositions obtained, the degree of crystallization (not crosslinked) was obtained by measuring the amount of heat by DSC (differential scanning calorimeter) at a temperature from 30° C. to 160° C., at a temperature increasing rate of 10° C./minute, obtaining a fusion enthalpy value from the obtained chart, dividing the fusion enthalpy value by fusion enthalpy value of 288 J/g (literature value) of a complete crystal and multiplying the product by 100. The average diameter of crystals was obtained as a circle-equivalent diameter by subjecting a photograph of an image of a section of a resin composition (sectioned by a microtome) magnified by a transmission electron microscope or a photograph of a section of a resin composition obtained by elastic modulus mapping by AFM (atom force microscope) to binarization using image processing software (Winroof) (manufactured by MITANI CORPORATION). Note that the degree of crystallization and the average diameter of crystals were also obtained with respect to thermally crosslinked compositions (described later).

To evaluate the transparency of the resultant sealing film, a film having a thickness of 0.5 mm was prepared from each composition. The film was sandwiched by two glass plates, treated with heat for crosslinking in an oven at a temperature of 150° C. for 15 minutes, and cooled. The light transmittance (wavelengths of 400 to 1100 nm) of the resultant film was determined.

As the acceptance and rejection criteria, 0 was used for a film having a light transmittance of 90% or more, 0 was for a film having a light transmittance of 88% or more and less than 90% and x for a film having a light transmittance of less than 88%.

(Evaluation Results)
The evaluation results are shown in Table 1.

TABLE 1

| | | MFR (g/10 minutes) | $M_w$ | $M_w/M_n$ | Example 1 | Example 2 | Example 3 | Example 4 | Example 5 | Example 6 | Example 7 |
|---|---|---|---|---|---|---|---|---|---|---|---|
| Composition (parts by mass) | m-LLDPE(1) | 2.2 | 210,500 | 2.27 | — | — | — | — | — | — | — |
| | m-LLDPE(2) | 3.5 | 194,000 | 2.03 | 80 | 50 | 30 | — | — | — | 50 |
| | m-LLDPE(3) | 30 | 110,000 | 2.05 | — | — | — | 80 | 50 | 30 | — |
| | LDPE(1) | 1.2 | 255,000 | 3.28 | — | — | — | — | — | — | — |
| | LDPE(2) | 25 | 134,000 | 3.31 | — | — | — | — | — | — | — |
| | LDPE(3) | 70 | 249,000 | 7.95 | 20 | 50 | 70 | 20 | 50 | 70 | — |
| | LDPE(4) | 140 | 83,000 | 5.33 | — | — | — | — | — | — | 50 |

TABLE 1-continued

| | | | | | | | | | |
|---|---|---|---|---|---|---|---|---|---|
| Kneading | | Kneading temperature (° C.) | 120 | 120 | 120 | 120 | 120 | 120 | 120 |
| | | Rotation speed (rpm) | 60 | 60 | 60 | 60 | 60 | 60 | 60 |
| Crystal state | Not crosslinked | Crystalline degree (%) | 24 | 30 | 41 | 22 | 32 | 39 | 33 |
| | | Average crystal diameter (circle-equivalent diameter) (μm) | 0.051 | 0.087 | 0.113 | 0.028 | 0.047 | 0.061 | 0048 |
| | | Crystal diameter distribution (standard deviation/average crystal diameter) | 0.92 | 1.2 | 1.4 | 0.81 | 0.85 | 1.1 | 0.89 |
| | Crosslinked | Crystalline degree (%) | 14 | 20 | 27 | 13 | 20 | 25 | 19 |
| | | Average crystal diameter (circle-equivalent diameter)(μm) | 0.035 | 0.041 | 0.049 | 0.029 | 0.032 | 0.044 | 0.04 |
| Processability | | Softening temperature (° C.) | 95 | 97 | 99 | 87 | 96 | 97 | 96 |
| | | Evaluation of softening temperature | ◎ | ○ | ○ | ◎ | ○ | ○ | ○ |
| | | Processable temperature range (° C.) | 4 | 5.6 | 6.8 | 3.5 | 3.6 | 4.3 | 3.8 |
| | | Evaluation of processable temperature range | ○ | ○ | ○ | ○ | ○ | ○ | ○ |
| Transparency | | Light permeability (400-1100 nm) (%) | 90.9 | 90.5 | 90.1 | 91.3 | 91.1 | 90.2 | 90.7 |
| | | Evaluation of light permeability | ◎ | ◎ | ◎ | ◎ | ◎ | ◎ | ◎ |

| | | MFR (g/10 minutes) | $M_w$ | $M_w/M_n$ | Example 8 | Example 9 | Comparative Example 1 | Comparative Example 2 | Comparative Example 3 | Comparative Example 4 |
|---|---|---|---|---|---|---|---|---|---|---|
| Composition (parts by mass) | m-LLDPE(1) | 2.2 | 210,500 | 2.27 | — | — | 20 | 50 | — | — |
| | m-LLDPE(2) | 3.5 | 194,000 | 2.03 | — | — | — | — | 20 | 20 |
| | m-LLDPE(3) | 30 | 110,000 | 2.05 | 50 | 50 | — | — | — | — |
| | LDPE(1) | 1.2 | 255,000 | 3.28 | — | — | 80 | 50 | — | — |
| | LDPE(2) | 25 | 134,000 | 3.31 | — | 50 | — | — | 80 | — |
| | LDPE(3) | 70 | 249,000 | 7.95 | — | — | — | — | — | — |
| | LDPE(4) | 140 | 83,000 | 5.33 | 50 | — | — | — | — | 80 |
| Kneading | Kneading temperature (° C.) | | | | 120 | 120 | 120 | 120 | 120 | 120 |
| | Rotation speed (rpm) | | | | 60 | 60 | 60 | 60 | 60 | 60 |
| Crystal state | Not crosslinked | Crystalline degree (%) | | | 33 | 31 | 44 | 42 | 32 | 32 |
| | | Average crystal diameter (circle-equivalent diameter) (μm) | | | 0.045 | 0.05 | 1.9 | 1.6 | 1.5 | 1.4 |
| | | Crystal diameter distribution (standard deviation/average crystal diameter) | | | 0.84 | 0.9 | 1.7 | 1.5 | 1.4 | 1.3 |
| | Crosslinked | Crystalline degree (%) | | | 20 | 22 | 31 | 27 | 27 | 26 |
| | | Average crystal diameter (circle-equivalent diameter)(μm) | | | 0.032 | 0.035 | 0.74 | 0.62 | 0.53 | 0.45 |
| Processability | Softening temperature (° C.) | | | | 94 | 95 | 106 | 105 | 104 | 103 |
| | Evaluation of softening temperature | | | | ◎ | ◎ | X | X | X | X |
| | Processable temperature range (° C.) | | | | 3.6 | 3.8 | 8.6 | 7.2 | 6.9 | 6.2 |
| | Evaluation of processable temperature range | | | | ○ | ○ | ○ | ○ | ○ | ○ |
| Transparency | Light permeability (400-1100 nm) (%) | | | | 91.0 | 90.8 | 86.7 | 86.3 | 85.7 | 85.2 |
| | Evaluation of light permeability | | | | ◎ | ◎ | X | X | X | X |

As shown in Table 1, each composition of Examples 1 to 9 containing m-LLDPE having a weight average molecular weight of 200,000 or less and LDPE having a weight average molecular weight of 250,000 or less in a mass ratio (m-LLDPE:LDPE) in the range of 80:20 to 30:70, had a softening temperature of 70 to 100° C. and a temperature width suitable for processing of 3.5° C. or more. A solar cell sealing film obtained therefrom had a light transmittance of 90% or more. The compositions thus provided an acceptable result for every item of evaluation.

In contrast, the compositions of Comparative Examples 1, 3 and 4 having a mass ratio (m-LLDPE:LDPE) of 20:80 and the composition of Comparative Example 2 having a mass ratio of 50:50, a weight average molecular weight of the m-LLDPE in excess of 200,000 and a weight average molecular weight of the LDPE in excess of 250,000 had unacceptable softening temperature and transparency.

Examples 10 to 14

Then, the inventors investigated on a method for producing a preferable composition when an organic peroxide is included. First, masterbatches A to D were prepared by mixing an organic peroxide (2,5-dimethyl-2,5-di(t-butylperoxy)hexane) (PERHEXA 25B) into m-LLDPE or LDPE shown in Table 2. Subsequently, each of the masterbatches was mixed with the remaining resin component in the formulation shown in Table 3 to prepare each composition. The sealing films were prepared from the compositions and heated for crosslinking in the same manner as above in order to evaluate transparency, and light transmittance thereof was determined. The degree of crystallization and the average diameter of crystals were also measured for crosslinked compositions in the same manner as above.

TABLE 2

|  |  | MFR (g/10 minutes) | $M_w$ | $M_p$ | A | B | C | D |
|---|---|---|---|---|---|---|---|---|
| Formulation | m-LLDPE(2) | 3.5 | 194,000 | 165,000 | — | — | — | 100 |
|  | LDPE(3) | 70 | 249,000 | 73,000 | 100 | 100 | 100 | — |
|  | Organic peroxide | — | — | — | 0.5 | 1 | 1.5 | 1.5 |

TABLE 3

|  |  | MFR (g/10 minutes) | $M_w$ | $M_p$ | Example 10 | Example 11 | Example 12 | Example 13 | Example 14 |
|---|---|---|---|---|---|---|---|---|---|
| Formulation (parts by mass) | m-LLDPE(2) | 3.5 | 194,000 | 165,000 | 50 | 50 | 50 | 50 | |
|  | LDPE(3) | 70 | 249,000 | 73,000 | — | — | — | 50 | 50 |
|  | Masterbatch A | — | — | — | 50 | — | — | — | — |
|  | Masterbatch B | — | — | — | — | 50 | — | — | — |
|  | Masterbatch C | — | — | — | — | — | 50 | — | — |
|  | Masterbatch D | — | — | — | — | — | — | — | 50 |
|  | Organic peroxide | — | — | — | 1.25 | 1 | — | 1.5 | — |
| Kneading | Kneading temperature (° C.) | | | | 120 | 120 | 120 | 120 | 120 |
|  | Rotation speed (rpm) | | | | 60 | 60 | 60 | 60 | 60 |
| Crystal state | Crosslinked | Crystalline degree (%) | | | 25 | 24 | 22 | 29 | 31 |
|  |  | Average crystal diameter (circle-equivalent diameter) (μm) | | | 0.034 | 0.031 | 0.029 | 0.042 | 0.061 |
| Transparency | Light permeability (400-1100 nm) (%) | | | | 90.0 | 91.0 | 92.0 | 89.0 | 88.0 |
|  | Evaluation of light permeability | | | | ◎ | ◎ | ◎ | ○ | ○ |

As shown in Table 3, the whole or part of the organic peroxide was blended into LDPE to prepare each of masterbatches A to C. Then, masterbatches A to C were mixed with m-LLDPE to obtain the compositions of Examples 10 to 12. The composition of Example 13 was prepared by mixing the whole amount of the organic peroxide simultaneously with mixing of m-LLDPE and LDPE. The composition of Example 14 was obtained by blending the organic peroxide into m-LLDPE to prepare masterbatch D and then mixing masterbatch D with LDPE. The compositions of Examples 10 to 12 were compared to the compositions of Examples 13 and 14, and it was found that the thermally crosslinked films obtained had a higher light transmittance and thus it was confirmed that solar cell sealing films having a higher transparency can be obtained.

The present invention is not limited to the constitution of the above embodiment and Examples and can be modified in various ways in the range of the substance of the invention.

INDUSTRIAL APPLICABILITY

Owing to the present invention, it is possible to provide a solar cell sealing film and solar cell module high in quality and low in cost.

REFERENCE SIGNS LIST

11 Front side transparent protecting member
12 Backside protecting member
13A Front side sealing film
13B Backside sealing film
14 Solar cell

What is claimed is:

1. A composition for a solar cell sealing film comprising an ethylene-α-olefin copolymer polymerized using a metallocene catalyst (m-LLDPE), a low-density polyethylene (LDPE) and an organic peroxide, wherein
    a weight average molecular weight of m-LLDPE ($M_{w(m\text{-}LLDPE)}$) is 200,000 or less,
    a weight average molecular weight of LDPE ($M_{w(LDPE)}$) is 250,000 or less, and
    a mass ratio of m-LLDPE and LDPE (m-LLDPE:LDPE) is in a range of 80:20 to 30:70.

2. The composition for a solar cell sealing film according to claim 1, wherein the weight average molecular weight of m-LLDPE is 100,000 to 200,000 and the weight average molecular weight of LDPE is 50,000 to 250,000.

3. The composition for a solar cell sealing film according to claim 1, wherein a ratio ($M_{w(LDPE)}/M_{n(LDPE)}$), which is a ratio of the weight average molecular weight of LDPE ($M_{w(LDPE)}$) to a number average molecular weight of LDPE ($M_{w(LDPE)}$), is 1.0 or more larger than a ratio ($M_{w(m\text{-}LLDPE)}/M_{n(m\text{-}LLDPE)}$), which is a ratio of the weight average molecular weight of m-LLDPE ($M_{w(m\text{-}LLDPE)}$) to a number average molecular weight of m-LLDPE ($M_{n(m\text{-}LLDPE)}$).

4. The composition for a solar cell sealing film according to claim 1, wherein a ratio ($M_{w(LDPE)}/M_{n(LDPE)}$), which is a ratio of the weight average molecular weight of LDPE ($M_{w(LDPE)}$) to a number average molecular weight of LDPE ($M_{w(LDPE)}$), is 3.30 or more, and a ratio ($M_{w(m\text{-}LLDPE)}/M_{n(m\text{-}LLDPE)}$), which is a ratio of the weight average molecular weight of m-LLDPE ($M_{w(m\text{-}LLDPE)}$) to a number average molecular weight of m-LLDPE ($M_{n(m\text{-}LLDPE)}$), is 2.25 or less.

5. The composition for a solar cell sealing film according to claim 1, wherein an average diameter of crystals in the composition (not crosslinked) is 1.0 μm or less.

6. The composition for a solar cell sealing film according to claim 1, wherein a temperature at which a storage elastic modulus of the composition is 100 kPa is 70 to 100° C. and a difference between a temperature at which the storage elastic modulus of the composition is 30 kPa and a temperature at which the storage elastic modulus of the composition is 100 kPa is 3.5° C. or more.

7. The composition for a solar cell sealing film according to claim 1, wherein the organic peroxide is 2,5-dimethyl-2,5-di(t-butylperoxy)hexane.

8. A method for producing the composition for a solar cell sealing film according to claim 1, comprising the steps of
   preparing a masterbatch by mixing the organic peroxide and the LDPE, and
   mixing the masterbatch and the m-LLDPE.

9. A solar cell sealing film formed from the composition for a solar cell sealing film according to claim 1.

10. The solar cell sealing film according to claim 9, wherein the film is formed by calendering.

* * * * *